United States Patent
Chiu

(10) Patent No.: US 6,603,828 B1
(45) Date of Patent: Aug. 5, 2003

(54) CHIPSET WITH CLOCK SIGNAL CONVERTING

(75) Inventor: You-Ming Chiu, Taipei (TW)

(73) Assignee: Via Technologies, Inc., Taipei (TW)

(*) Notice: Subject to any disclaimer, the term of this patent is extended or adjusted under 35 U.S.C. 154(b) by 0 days.

(21) Appl. No.: 09/435,997

(22) Filed: Nov. 8, 1999

(30) Foreign Application Priority Data

Apr. 2, 1999 (TW) ........................................ 88105248 A

(51) Int. Cl.$^7$ ................................................ H04L 7/00
(52) U.S. Cl. ..................... 375/354; 395/550; 364/270; 364/271
(58) Field of Search ........................ 375/354; 395/550; 364/270, 271

(56) References Cited

U.S. PATENT DOCUMENTS 3,564,507 A * 2/1971 Faivre et al. ............... 713/601
5,535,377 A * 7/1996 Parks ........................ 713/400
5,884,100 A 3/1999 Normoyle et al.

FOREIGN PATENT DOCUMENTS

DE         19952747 A1    6/2000

* cited by examiner

Primary Examiner—Stephen Chin
Assistant Examiner—Guillermo Munoz
(74) Attorney, Agent, or Firm—Rabin & Berdo, P.C.

(57) ABSTRACT

A signal converting device and method for converting signals from memory interfaces into main system interfaces. The present invention can completely convert response signals from high frequency devices into low frequency devices, for solving low efficient and disadvantages caused by asynchronous conversion. The signal loss is not occurred when the signal converting device is in pseudo synchronization. By applying the present invention, the computer system can work normally and rapidly, in which the frequency of the request signals from the main system interface is higher than half of the frequency of the response signals from the memory interface. The compurter system is, for example computer system for 100 MHz/133 MHz or 66 MHz/100 MHz.

35 Claims, 6 Drawing Sheets

US 6,603,828 B1

CHIPSET WITH CLOCK SIGNAL CONVERTING

BACKGROUND OF THE INVENTION

This application incorporates by reference Taiwanese application Serial No. 88105248, Filed May 4, 1999.

FIELD OF THE INVENTION

The present invention relates in general to a signal converting device of a chipset, and more particularly to a signal converting device capable of effectively outputting/converting a response signal from a memory interface into a main system interface.

DESCRIPTION OF THE RELATED ART

Due to the rapid development on hardware technologies, the clock frequency for the central processing unit (CPU) has improved from several MHz to hundred MHz. For matching the CPU clock frequency, the mainboard has to provide high-frequency clock signals. However, in the prior personal computer (PC), other peripheral devices operate at a slower speed than CPU. The request signal from CPU is faster than the response signal from peripheral devices. As known, the processing rate of CPU is obtained from its inner frequency multiplied by a multiple. For example, 266 MHz is obtained from 66 MHz multiplied by 4, wherein 66 MHz is an inner frequency, and 4 is a multiplier. Nowadays, in current mainboards, the inner frequency of CPU is, for example, 100 MHz, 83 MHz, or 66 MHz. The clock frequency for memory devices, such as dynamic random access memory (DRAM), is, for example, 100 MHz, 83 MHz, 66 MHz or 50 MHz. The clock frequency for the peripheral component interconnection (PCI) interface can be 66 MHz or 33 MHz. The clock frequency for the accelerate graphics port (AGP) interface can be 66 MHz or 133 MHz. There has developed a signal conversion method capable of converting high-frequency request signals from a main system and low-frequency response signals from peripheral devices, such as conversion between 100 MHz/66 MHz or 133 MHz/100 MHz.

Referring to FIG. 1, which illustrates a block diagram for a chipset in a mainboard according to the prior art. In FIG. 1, the clock generator 110 supplies the chipset 100 with two clock signals CLK-A and CLK-B of different frequency. There is an integral ratio between the frequency of the two clock signals CLK-A and CLK-B. For example, when the clock signals CLK-A and CLK-B are respectively 100 MHz and 66 MHz, the integral ratio is about 3:2. That is to say, 3 cycles of the clock signal CLK-A is equal to 2 cycles of the clock signal CLK-B. In the following description, one clock CLK-A cycle refers to one cycle of the clock signal CLK-A.

In the chipset 100, there are three subsystems: main system interface 120, memory interface 130 and AGP/PCI interface 140. The clock signal CLK-A is coupled to a multiplexer (MUX) 122 and then coupled to buffer 124. The output signal CLK-1 from the buffer 124 is coupled to the main system interface 120. The selection signal SEL selects the signals CLK-A or CLK-B via the MUX 132, and then the buffer 134 supplies a signal CLK-2 for the memory interface 130. The signal CLK-B is coupled to the multiplexer (MUX) 142 and then coupled to buffer 144. The output signal CLK-3 from the buffer 144 is input into the AGP/PCI interface 140. The selection signal SEL, which selects different clock signals for the memory interface, is setup by the basic input output system (BIOS) or jump switches on the main board. MUX 122, 132 and 142 are used for making the propagation delay of the three clock signals CLK-1, CLK-2 and CLK-3 approach each other, rather than for selecting signals.

The clock signals CLK-A and CLK-B are coupled to the phase signal generator 150 for supplying signal converting circuits 160, 162 and 164 with phase signals. The number of output signals from the phase signal generator 150 depends on the number of the higher-frequency clock cycles. For example, if 3 cycles of the clock signal CLK-A is equal to 2 cycles of the clock signal CLK-B, the phase signal generator 150, referring to the clock signal CLK-A, generates 3 phase signals PH1, PH2 and PH3. The signal converting circuits 160, 162 and 164 provide a signal propagation path between the main system interface 120, the memory interface 130 and the AGP/PCI interface 140.

FIG. 2 illustrates a timing chart in FIG. 1. FIG. 2 shows the relationship between the clock signals CLK-A and CLK-B and the three phase signals PH1, PH2 and PH3. The clock signals CLK-A and CLK-B are in pseudo synchronization. In other words, the difference between the starting point for the first cycle of the clock signal CLK-A and the first cycle of the clock signal CLK-B is shorter than a predetermined interval; and the difference between the starting point for the (3N+1)th cycle of the clock signal CLK-A and the (2N+1)th cycle of the clock signal CLK-B is also shorter than the predetermined interval, wherein N is a positive integer. The phase signals PH1, PH2 and PH3 appear as enabled signals alternatively, wherein an enabled signal represents a high-level signal or a signal at enabled state. The phase signal PH1 becomes enabled in the (3M−2)th cycle of the phase signal CLK-A. The phase signal PH2 becomes enabled in the (3M−1)th cycle of the phase signal CLK-A. The phase signal PH3 becomes enabled in the 3Mth cycle of the phase signal CLK-A, wherein M is a positive integer.

However, there are also great improvements on peripheral devices. For example, a clock frequency of DRAM may be faster than the inner clock frequency of CPU. The DRAM access rate may be 100 MHz or 133 MHz, and the CPU inner clock frequency may be 66 MHz or 100 MHz. When the DRAM clock frequency is faster than the CPU inner clock frequency, not every response signal can be completely converted and returned to the main system according to the prior art. For example, the response signals generated from the phase signals PH1 and PH3 may occur error and cause signal loss during signal converting. During each signal converting, a signal processing period must be reserved. When the signal processing is in asynchronous mode, it usually happens that only part of signals are completely converted. Now refer to FIG. 3 and 4.

FIG. 3 illustrates a signal converting circuit block diagram shown in FIG. 1, wherein the signal converting circuit represents circuits 160, 162 and 164 in FIG. 1. The input signal SG-I refers to the clock signal CLK-A or CLK-B. The signal converting circuit converts the input signal SG-I into the output signal SG-O. The output signal SG-O also refers to the clock signal CLK-A or CLK-B. The generation of the output signal SG-O relates to the input signal SG-I, the clock signals CLK-A and CLK-B, and the phase signals PH1, PH2 and PH3. Therefore, input signals of the circuit in FIG. 3 further comprise the clock signals CLK-A and CLK-B, and the phase signals PH1, PH2 and PH3.

FIG. 4 shows a timing chart of the signal converting circuit in FIG. 3. The following statement is under the case that the frequency ratio between the clock signals CLK-A and CLK-B is 3:2. In practical circuit design, there must exist a timing delay during signal conversion. If the input signal SG-I is at high frequency, and the output signal is at low frequency, there are three signal conversion types. When the input signal SG-I is the timing A1, A2 and A3 respectively, the output signal is the timing B1, B2 and B3 respectively. Then, the output signal is the timing B4 when the input signal SG-I is the timing A4. However, from FIG. 4, it is clear that the timing B3 is the same as the timing B4. That is to say, the conversion result from the first signal in the current three signals may cover the conversion result from the third signal in the previous three signals, and a signal loss occurs. When the signal conversion from main systems to memory interfaces is slow to fast, such as 66 MHz to 100 MHz, signal conversion can not be completely made.

The prior art has three modes for solving the above signal-loss disadvantage:

1. Abandoning;

That is to say, in computer systems, the main system frequency must always be faster than the memory frequency.

2. Operating the Request Signals in Non-pipeline Mode:

In the non-pipeline mode for the request signals, the next request signal is not accepted until the current response signal becomes ready. Therefore, the request rate and the response rate are lowered and so is the signal conversion rate; and 3. Operating in Non-back-to-back Ready Mode:

In signal converting, even with the request signals operating in pipeline transmission mode, a waiting interval is reserved in successively transmitting ready signal. Because of reserving signal processing interval, each signal can be completely converted and transmitted. In this mode, the signal-converting rate is much lowered because the waiting time for response is increased and the response rate is lowered.

Conventionally, when a back-to-back ready mode is applied and the response rate for DRAM is faster than the request rate for CPU, the ready signal cannot be converted one by one. Because the signal converting is in asynchronous mode, as described above, it may happen that only part of signals can be completely converted. Therefore, this prior art is not a preferred solution for signal converting. The results of signal converting have great impact on the performance of a computer system. If the signal transferring between systems is not well made, it may happen that systems cannot operate properly. The peripheral devices for the main system, for example memory devices, usually have a great effect on the stability of the main system. Therefore, the signal converting device plays an important role on computer systems.

SUMMARY OF THE INVENTION

It is therefore an object of the invention to provide an improved method and means for converting signals from memory interfaces at higher frequency into main system interfaces at lower frequency. The present invention can completely convert response signals from high frequency devices to low frequency devices, and solve low efficient and disadvantages caused by asynchronous conversion. The signal loss does not occur when the signal converting circuit is in pseudo synchronization. By employing the present invention, the computer system can work normally and rapidly, in which the frequency for the request signals from main system interfaces is higher than half of the frequency for the response signals from memory interfaces. The computer system is, for example, 100 MHz/133 MHz or 66 MHz/100 MHz.

The present invention achieves the above-mentioned object by providing a chipset with clock signal converting. By applying a signal converting device in the chipset, response signals from memory interfaces can be effectively and correctly converted and output. The signal converting device converts an input signal, which refers to a first clock, into an output signal, which refers to a second clock. A period of m first clock cycles is equal to that of n second clock cycles wherein m and n are both smallest positive integers satisfying $2n>m>n$. The first clock comprises m phase signals, each of which alternatively appears as enabled signals. One period for each phase signal appearing as an enabled signal is equal to one first clock cycle. The input signal comprises a first ready head signal and a first ready tail signal.

In the above chipset, a D-type flip-flop is applied to delay the first ready head signal for one first clock cycle to generate an extension ready head signal. Another D-type flip-flop is further applied to delay the first ready tail signal for one first clock cycle to generate an extension ready tail signal. A logic gate is further applied to generate an extension signal. When the extension ready tail signal and a first phase signal of m phase signals both appear as enabled signals, the extension signal is also an enabled signal. A multiplexer selects and then outputs an extension ready tail signal. The extension ready tail signal comes from part of the enabled first ready tail signal delayed for one first clock cycle. When the extension signal and the first ready tail signal both appear as enabled signals, the first ready tail signal is delayed for one first clock cycle; and an extension ready head signal is generated at the same time for synchronously extending the extension ready tail signal and the extension ready head signal. At last, a signal converting circuit receives the first clock, the second clock, the extension ready tail signal, the extension ready tail and the m phase signals, and generates an output signal by the pseudo synchronization between the first clock and the second clock.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

By applying the signal converting devices according to the present invention, computer systems, in which the request signal frequency from main systems is between half and one of the response signal frequency from memory interfaces, can normally work.

Figure 5:
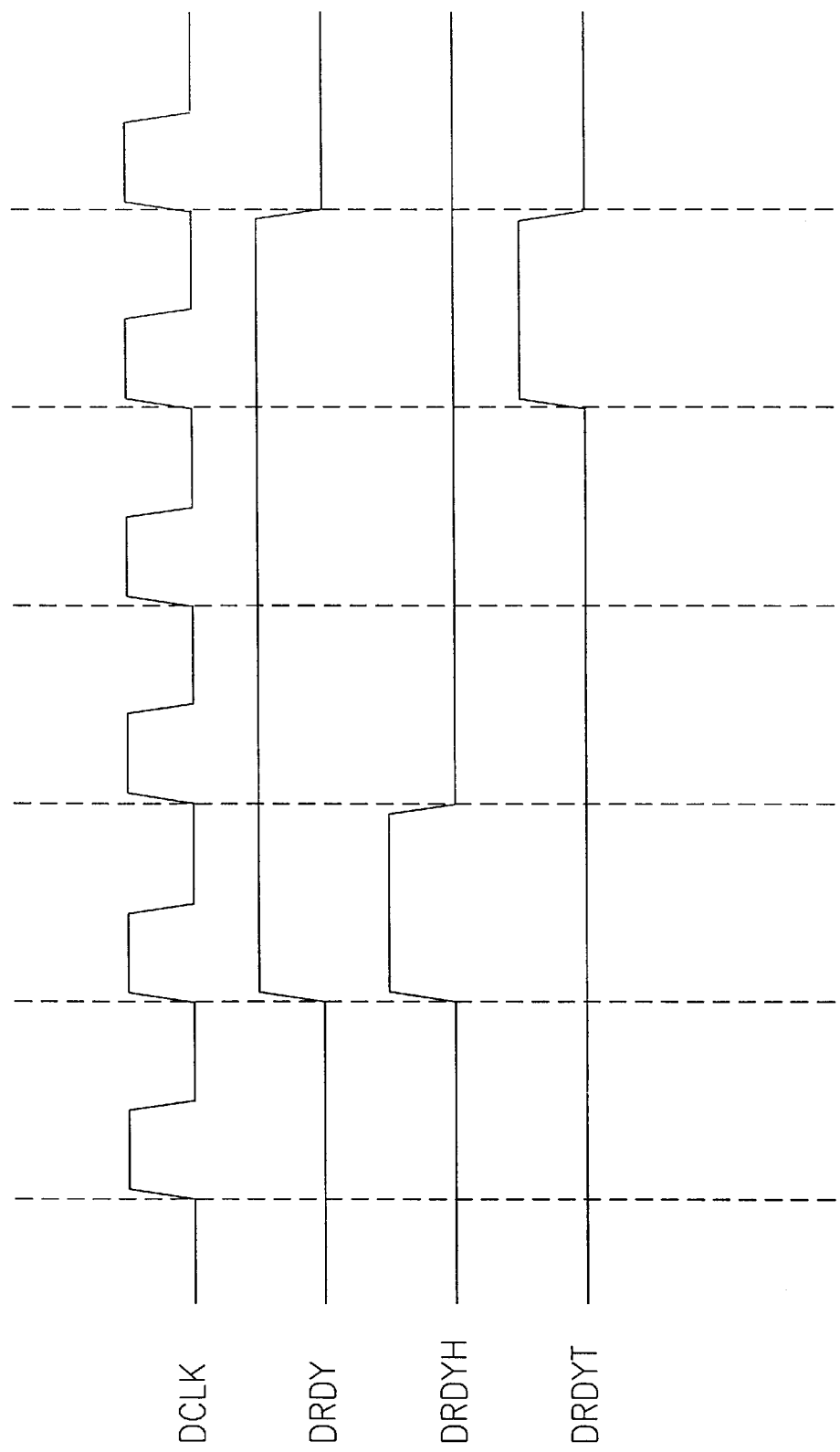
FIG. 5 illustrates a timing chart for a head signal and a tail signal of a ready signals.

A response signal is generated from peripheral devices in response to a request signal from main systems. Referring to FIG. 5, which shows a timing chart for a head signal and a tail signal of a ready signal. In the present invention, a high-level signal is considered as an enabled signal. An enabled signal refers to a signal at enabled state. A response signal is generated from peripheral devices in response to a request signal from a main system. First, the ready signal DRDY is at high level. A response signal, for example a response signal of 4 bits, needs 4 clock cycles for transmission, and the ready signal DRDY needs to maintain high-level for 4 clock cycles. For each enabled ready signal DRDY, at least one response signal is generated. Each response signal has its own head signal and tail signal. When the response signal begins, the ready head signal DRDYH appears as high level. When the response signal comes to end, the ready tail signal DRDYT appears as high level. The ready head signal DRDYH and the ready tail signal DRDYT are generated in pairs. Taking FIG. 5 for example, both the ready head signal DRDYH and the ready tail signal DRDYT appear in a high level once when the ready signal DRDY is at high level. That is to say, a response signal is generated during this cycle.

In the signal converting devices according the present invention, a head signal and a tail signal of each response signal are reserved. The identification for each response signal is made by the head signal and the tail signal of the response signal for preventing from signal loss during signal converting. Of course, the head signal begins prior to the tail signal, and they are generated in pairs. In the following description for the preferred embodiment, the clock frequency for main system and memory devices (DRAM) are 66 MHz and 100 MHz, respectively.

Figure 6:
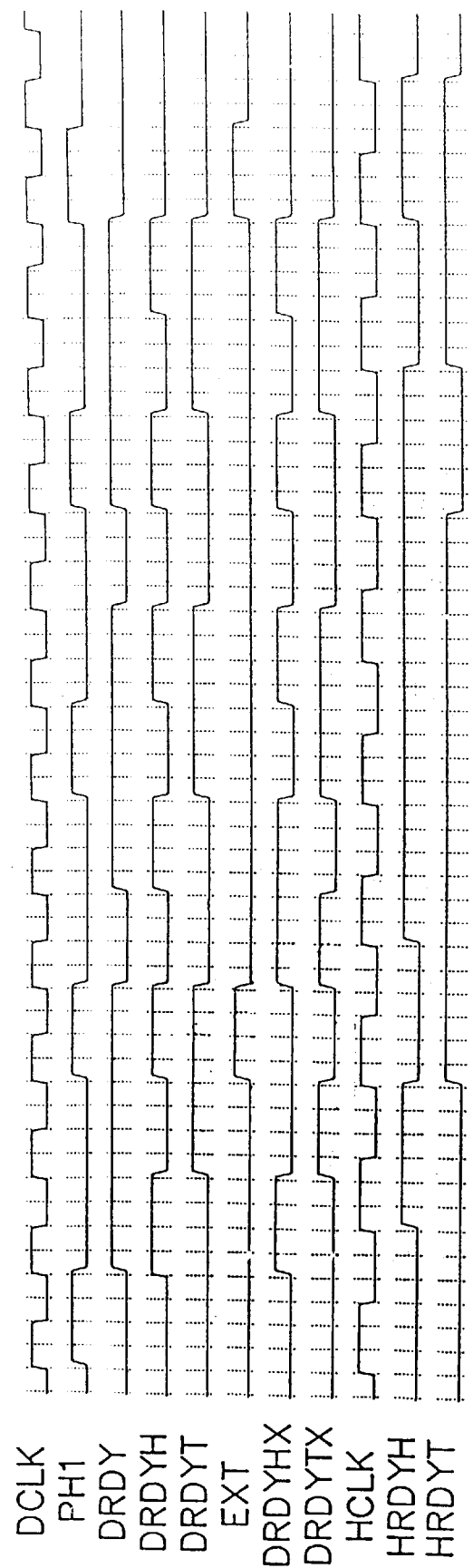
FIG. 6 shows a timing chart for signal converting according to a preferred embodiment for the present invention.

Referring to FIG. 6, which shows a timing chart of signal converting according to the embodiment of the present invention. In FIG. 6, the clock signal DCLK is a clock signal for 100 MHz DRAM. The phase signal PH1 is a phase signal of the clock signal DCLK, and one enabled period of the phase signal PH1 is equal to one clock DCLK cycle. From FIG. 6, it is known 3 cycles of DRAM clock DCLK are equal to 2 cycles of main system clock HCLK. As described above, the clock signal DCLK further comprises phase signals PH2 and PH3, but FIG. 6 only shows the phase signal PH1 for simplicity. The ready signal DRDY is an enabled timing of DRAM response signal. As described in the related art, in each ready signal DRDY, different response signals may be adjacent to others. Signal loss may occur during signal conversion. In the present invention, each response signal is identified by its own head signals and tail signals, so disadvantages of the prior art can be solved.

Referring to FIG. 6 again, a ready head signal DRDYH is a head signal of a DRAM response signal. In this embodiment, the number of the response signals is represented by the number of the enabled ready head signals DRDYH. Between each enabled period for the ready head signal DRDYH, there must exist an interval, for example one cycle of the clock signal DCLK. Therefore, each response signal at least has 2 or more response cycles. For example, after a request signal is sent from the main system, a response signal from DRAM has 2 or more response cycles. The number of the response signals is represented by the number of the enabled ready head signal DRDYH; and the enabled period of the ready head signal DRDYH is separated from each other. One response signal produces one enabled period of the ready head signal DRDYH and the enabled period maintains for one cycle of the clock signal DCLK. In computer systems, the response signal from DRAM usually has 2 or more response cycles so that it has no impact on the effect of the present invention.

In FIG. 6, a ready tail signal DRDYT is a tail signal of each DRAM response signal. The number of the response signals is represented by the number of the clock DCLK cycles in the enabled ready head signal DRDYH. The response signals from DRAM usually have 2 or more response cycles, if some response signal has just 2 response cycles, the enabled period for the ready tail signal DRDYT is adjacent by the enabled period for the next ready tail signal DRDYT. In the prior art, this kind of adjacent situation may cause an error operation.

Therefore, the present invention introduces an extension signal EXT for solving the adjacent situation between the enabled periods for the ready tail signal DRDYT. In FIG. 6, the enabled period of the extension signal EXT appears when both the phase signal PH1 and a delayed ready tail signal DRDYTQ appear as enabled. The delayed ready tail signal DRDYTQ is generated from the ready tail signal DRDYT synchronously delayed for one clock cycle. The extension signal EXT is represented by the following logic operation:

$$EXT = PH1 \text{ and } DRDYTQ$$

The extension signal EXT is shown in FIG. 6. When the ready tail signal DRDYT and the extension signal EXT are both enabled, the ready tail signal DRDYT is delayed for one clock cycle and an extension ready tail signal DRDYTX shown in FIG. 5 is generated. Because the ready head signal DRDYH is synchronous with the ready tail signal DRDYT, when the ready tail signal DRDYT is delayed, the ready head signal DRDYH is delayed synchronously, and an extension ready head signal DRDYHX, shown in FIG. 5, is generated, too.

Referring to FIG. 6 again. In FIG. 6, the clock signal HCLK is, for example, a clock signal for 66 MHz main system. By applying the present invention, the ready head signal DRDYH and the ready tail signal DRDYT are converted into a ready head signal HRDYH and a ready tail signal HRDYT of the clock signal HCLK for the main system respectively, as shown in FIG. 6.

Of course, each response signal has a head signal and a tail signal. Therefore, the enabled ready head signal DRDYH comprises the same number of the clock DCLK cycles as the enabled ready tail signal DRDYT. After signal conversion, the number of the clock HCLK cycles in the ready head signal HRDYH is the same as the number of the clock HCLK cycles in the ready tail signal HRDYT, the number of the clock signal DCLK cycles in the enabled ready head signal DRDYH and the number of the clock signal DCLK cycles in the enabled ready tail signal DRDYT. So, the response signal can be completely converted.

Figure 4:
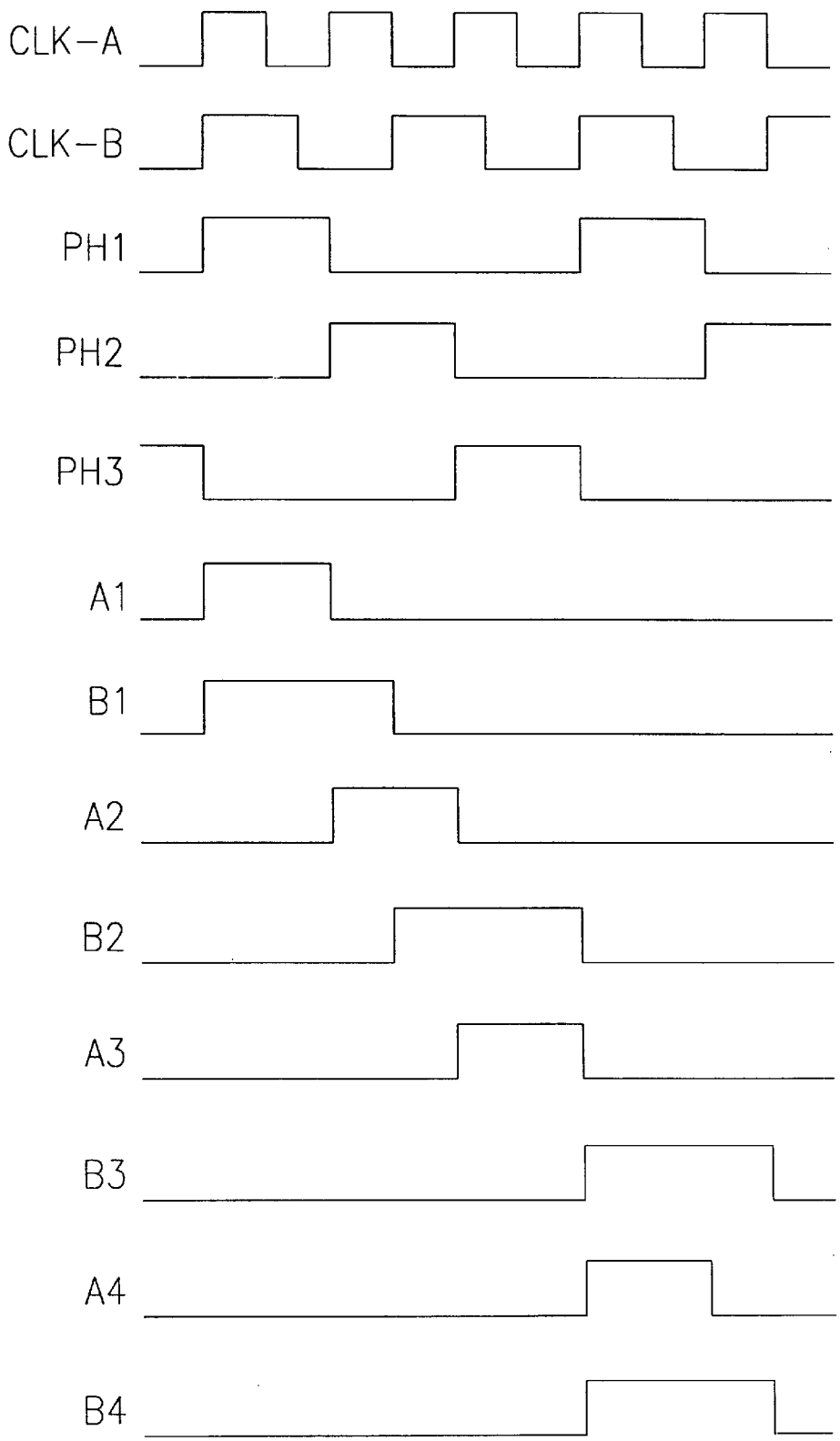
FIG. 4 shows a timing chart for signal converting for signal converting circuit in FIG. 3.

Taking the ready head signal DRDYH and the ready tail signal DRDYT in FIG. 6 for example, the ready head signal DRDYH totally has 6 operation signals and therefore, the enabled period for the ready head signal DRDYH comprises 6 clock cycles of the clock signal DCLK. The enabled period for the ready tail signal DRDYT also has 6 operation signals. As described above, a signal loss occurs if there exists adjacent situations between the enabled periods for the ready tail signal DRDYT. In the present invention, by applying the extension signal EXT, the ready tail signal DRDYT, which may cause error operation, is delayed for one clock cycle and so is the ready head signal DRDYH. The extension ready head signal DRDYHX and the extension ready tail signal DRDYTX can be respectively converted into the ready head signal HRDYH and the ready tail signal HRDYT according to the clock signal DCLK and the clock signal HCLK. Both one enabled period of the ready head signal HRDYH and one enabled period of the enabled ready tail signal HRDYT comprise 6 HCLK clock cycles. The signal converting method is shown as the prior art of FIG. 4, but no error operations occur.

Figure 7:
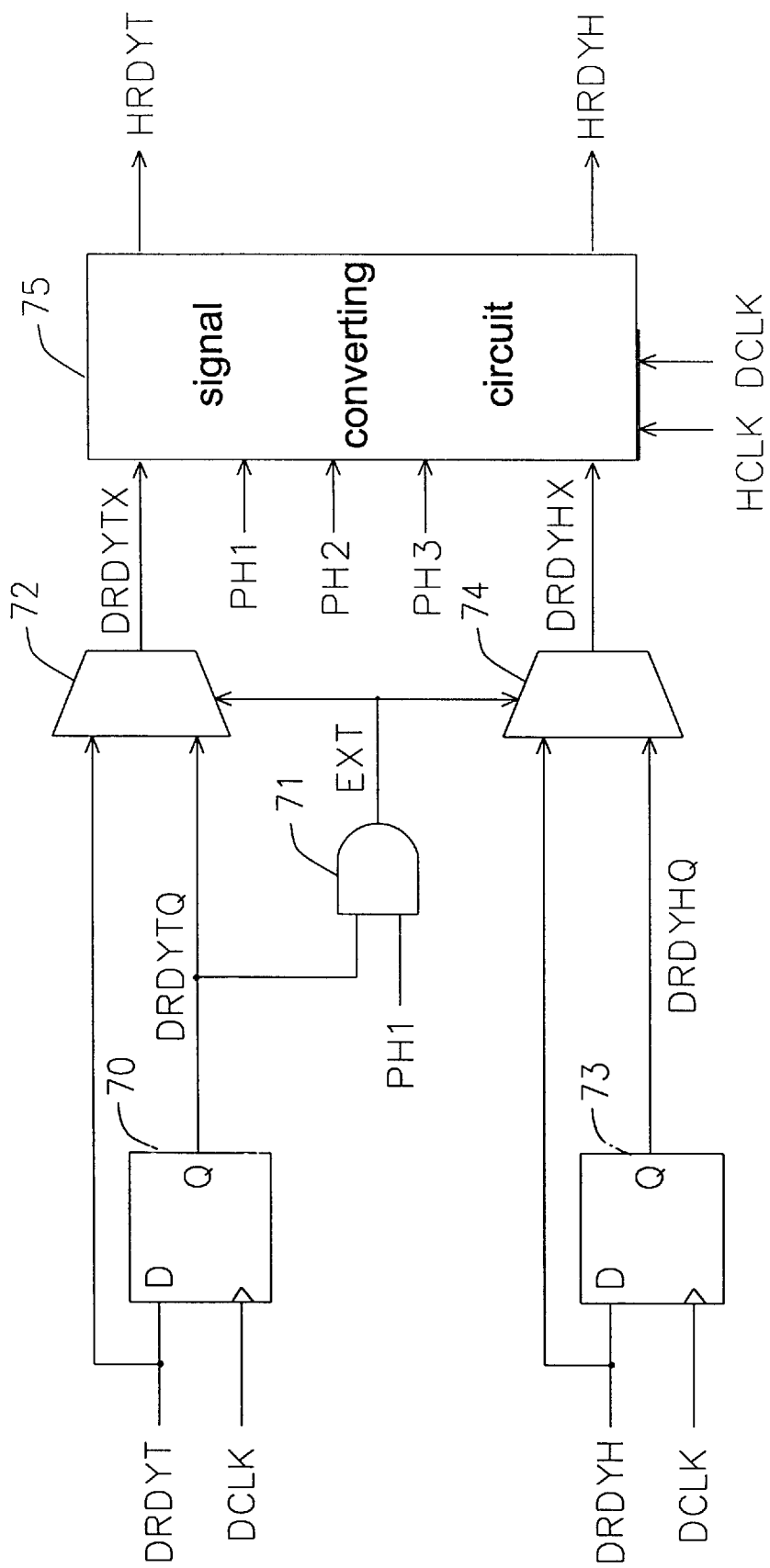
FIG. 7 shows a block diagram for a signal converting circuit with a timing chart of FIG. 6.

Referring to FIG. 7, the D-type flip-flop 70 receives the ready tail signal DRDYT and the clock signal DCLK and then outputs a delayed ready tail signal DRDYTQ. The delayed ready tail signal DRDYTQ comes from the ready tail signal DRDYT synchronously delayed for one clock DCLK cycle. The delayed ready tail signal DRDYTQ and the phase signal PH1 are input into an AND gate 71 which outputs an extension signal EXT.

A multiplexer 72 receives the ready tail signal DRDYT and the delayed ready tail signal DRDYTQ, and then outputs an extension ready tail signal DRDYTX under the control of the extension signal EXT. When the extension signal EXT is enabled, the ready tail signal DRDYT, being enabled at the same time, is delayed for one clock DCLK cycle; and the extension ready tail signal DRDYTX is generated.

Another D-type flip-flop 73 receives the ready head signal DRDYH, and outputs a delayed ready head signal DRDYHQ under the control of the clock signal DCLK. Similarly, the delayed ready head signal DRDYHQ is generated from the input signal DRDYH synchronously delayed for one clock DCLK cycle. The ready head signal DRDYH and the delayed ready head signal DRDYHQ are input into another multiplexer 74. Under the control of the extension signal EXT, the multiplexer 74 generates an extension ready head signal DRDYHX. When the ready tail signal DRDYT is delayed for one clock DCLK cycle, the multiplexer 74 delays the ready head signal DRDYH for one clock DCLK cycle under the control of the extension signal EXT. If the ready tail signal DRDYT is not delayed by the multiplexer 72, the ready head signal DRDYH is not delayed by the multiplexer 74, neither.

Figure 1:
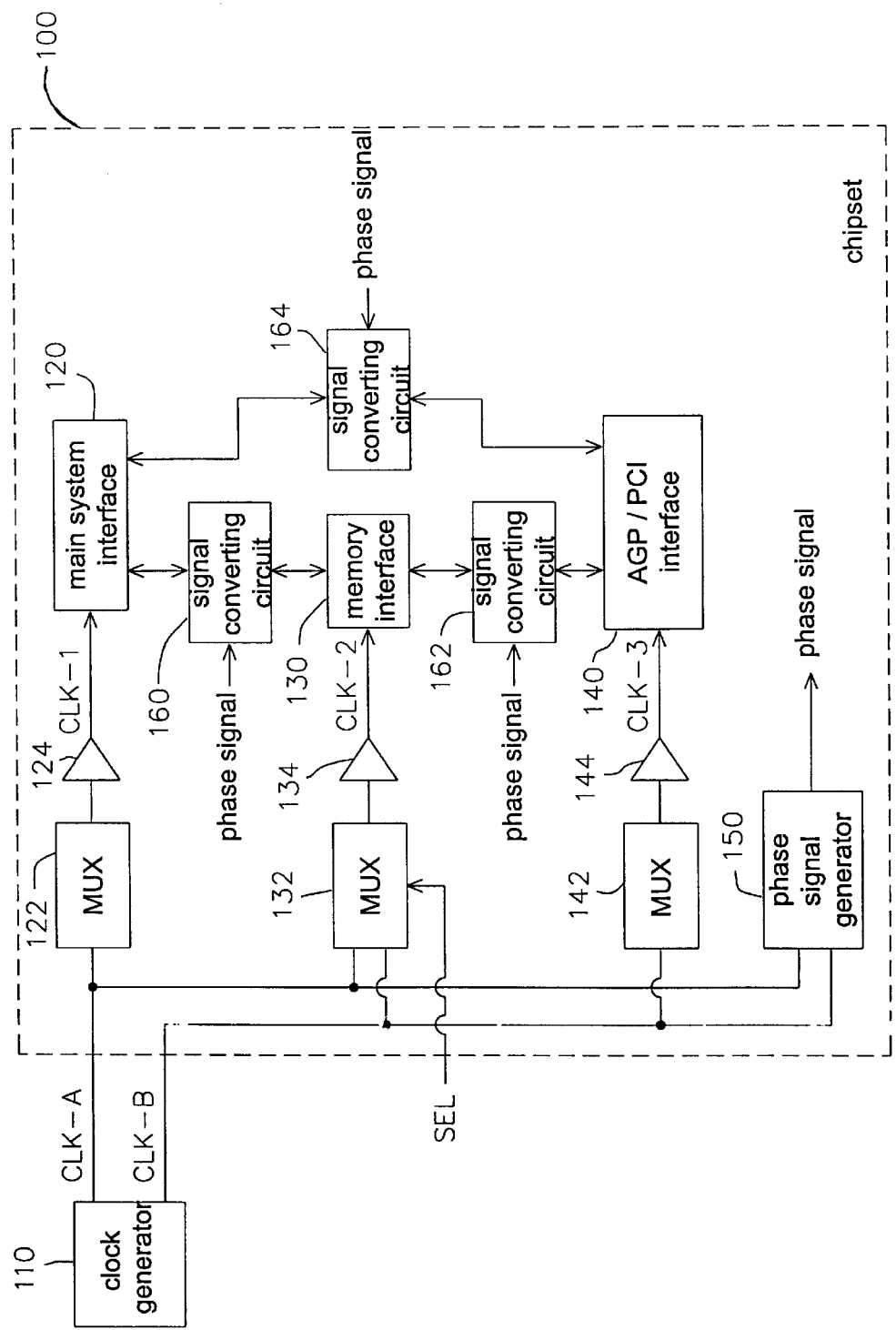
FIG. 1 is a block diagram for a chipset on conventional computer mainboard.
Figure 2:
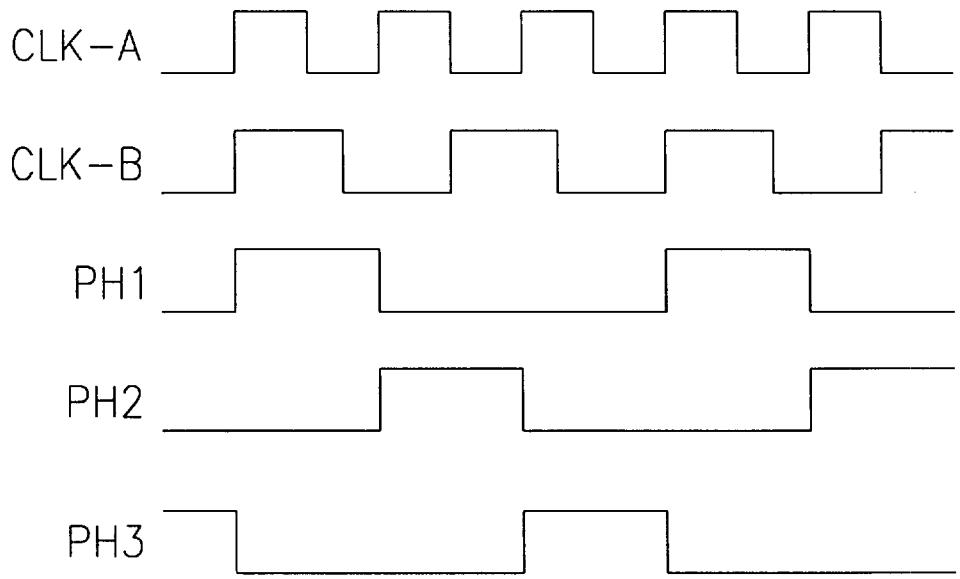
FIG. 2 is a timing chart for signal devices in FIG. 1.
Figure 3:
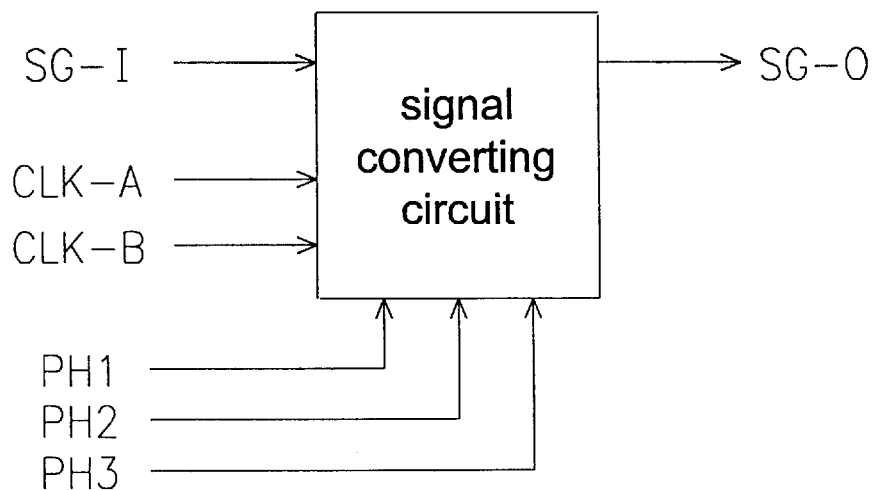
FIG. 3 illustrates a block diagram for signal converting circuit in FIG. 1.

The extension ready head signal DRDYHX and the extension ready tail signal DRDYTX are input into a signal converting circuit 75. The signal converting circuit 75 receives two clock signals, HCLK and DCLK, and three phase signals, PH1, PH2 and PH3. The signal converting circuit 75, for example, the signal converting circuit in FIG. 3, is used for converting and outputting signals. In this embodiment, the circuit 75 is used for 100 MHz to 66 MHz converting, wherein 100 MHz represents the DRAM frequency, and 66 MHz represents the main system frequency. However, by applying head signals and tail signals and under the control of the extension signal EXT, there are no error operations like in the prior art. The extension ready head signal DRDYHX and the extension ready tail signal DRDYTX are converted into the ready head signal HRDYH and the ready tail signal HRDYT, respectively.

In this embodiment, the signal converting circuit is used for 100 MHz to 66 MHz converting, so only three phase signals are taken into consideration. If the frequency of the main system is higher than half of the frequency of the memory device; and a ratio between the two frequency is a simple integral ratio (for example, 2:3), a signal converting with no signal loss can be made by applying the device and method of the present invention. When a ratio between the clock frequency for DRAM and the clock frequency for main system is, for example, m:n, there are m phase signal(s) involved, wherein m and n are both smallest positive integers satisfying 2n>m>n.

The technological characteristic of the preferred embodiment in the present invention can be applied in any chipset with clock signal converting, not only in clock signal converting for chipsets in computer systems.

One characteristic of the present invention relies on effectively converting response signals from memory interfaces into main system interfaces in chipsets.

Another characteristic of the present invention relies on effectively converting response signals by applying extension signals in the case of the adjacent tail signals of the response signal.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A signal converting device in a chipset, converting an input signal, which refers to a first clock, into an output signal, which refers to a second clock, m cycle(s) of the first clock being equal to n cycle(s) of the second clock, wherein m and n are both positive integers satisfying 2n>m>n, the signal converting device comprising:

a first flip-flop, receiving the first clock and a first ready head signal of the input signal, and outputting a delayed ready head signal which is the result of the first ready head signal being delayed for one first clock cycle;

a second flip-flop, receiving the first clock and a first ready tail signal of the input signal, and outputting a delayed ready tail signal which is the result of the first ready tail signal being delayed for one first clock cycle;

a logic gate, receiving the delayed ready tail signal and a phase signal, and outputting an extension signal, wherein the extension signal is enabled when both the delayed ready tail signal and the phase signal are enabled;

a first multiplexer, receiving the first ready tail signal, the delayed ready tail signal and the extension signal, and outputting an extension ready tail signal under the control of the extension signal;

a second multiplexer, receiving the first ready head signal, the delayed ready head signal and the extension signal, and outputting an extension ready head signal under the control of the extension signal; and a signal converter, receiving the extension ready tail signal, the extension ready head signal, the first clock and the second clock, and outputting a second ready head signal and a second ready tail signal of the output signal;

wherein the first clock and the second clock are in pseudo synchronization; one cycle of the phase signal is m times of one first clock cycle; and one period for the enabled phase signal is equal to one first clock cycle.

2. A signal converting device according to claim 1, wherein the first clock is a DRAM clock.

3. A signal converting device according to claim 2, wherein the second clock is a main system clock.

4. A signal converting device according to claim 3, wherein the input signal is a response signal.

5. A signal converting device according to claim 1, wherein the first flip-flop is a D-type flip-flop.

6. A signal converting device according to claim 1, wherein the second flip-flop is a D-type flip-flop.

7. A signal converting device according to claim 1, wherein the extension ready tail and the extension ready head signal are in synchronous extension.

8. A signal converting device according to claim 1, wherein the first ready head signal is generated in a head signal of the enabled input signal.

9. A signal converting device according to claim 1, wherein the first ready tail signal is generated in a tail signal of the enabled input signal.

10. A signal converting device according to claim 1, wherein the number of the first clock cycles in the enabled first ready head signal is equivalent to the number of the first clock cycles in the enabled first ready tail signal, the number of the second clock cycles in the enabled second ready head signal and the number of the second clock cycles in the enabled second ready tail signal.

11. A signal converting device according to claim 1, wherein the enabled first ready head signals are separated from each other.

12. A signal converting device according to claim 1, wherein m is 3 and n is 2.

13. A signal converting device according to claim 1, wherein the logic gate is an AND gate.

14. A signal converting device according to claim 1, wherein the chipset is a chipset in a computer mainboard.

15. A signal converting device in a chipset on a mainboard, the signal converting device receiving a first clock and a second clock, m first clock cycles being equal to n second clock cycle(s), wherein m and n are both positive integers satisfying 2n>m>n, the signal converting device comprising:

a first logic circuit unit, for receiving an input signal, the input signal comprising a first ready head signal and a first ready tail signal, the first logic circuit unit further for outputting a delayed ready head signal and a delayed ready tail signal, the delayed ready head signal being generated from the first ready head signal delayed for one first cycle, and the delayed ready tail signal being generated from the first ready tail signal delayed for one first cycle;

a second logic circuit unit, for receiving an extension signal, the delayed ready head signal and the delayed ready tail signal, and for outputting an extension ready tail signal and an extension ready head signal, the extension signal appearing as an enabled signal when both the delayed ready tail signal and a first phase signal of m phase signals appearing as enabled signals, wherein the m phase signals alternatively appear as enabled signals in every m first clock cycles, the enabled period of each of the m phase signals equal to one first clock cycle;

wherein the extension ready tail signal is generated from part of the enabled first ready tail signal delayed for one first clock cycle, wherein the first ready tail signal is delayed for one first clock cycle when the extension signal and the first ready tail signal both appear as enabled signals;

wherein the extension ready head signal is generated from part of the enabled first ready head signal delayed for one first clock cycle, wherein the first ready head signal is delayed for one first clock cycle when the extension signal and the first ready tail signal both appear as enabled signals; and a signal converter, receiving the first clock, the second clock, the extension ready tail signal, the extension ready head signal and the m phase signals, and outputting an output signal by a pseudo synchronization between the first clock and the second clock, wherein the output signal comprises a second ready head signal and a second ready tail signal referring to the second clock.

16. A signal converting device according to claim 15, wherein the first clock is a DRAM clock.

17. A signal converting device according to claim 16, wherein the second clock is a main system clock.

18. A signal converting device according to claim 17, wherein the input signal is a response signal.

19. A signal converting device according to claim 15, wherein the first ready head signal is generated in a head signal of the enabled input signal.

20. A signal converting device according to claim 15, wherein the first ready tail signal is generated in a tail signal of the enabled input signal.

21. A signal converting device according to claim 15, wherein the number of the first clock cycles in the enabled first ready head signal is equivalent to the number of the first clock cycles in the enabled first ready tail signal, the number of the second clock cycles in the enabled second ready head signal and the number of the second clock cycles in the enabled second ready tail signal.

22. A signal converting device according to claim 15, wherein the enabled first ready head signal is separated from each other.

23. A signal converting device according to claim 15, wherein m is 3 and n is 2.

24. A signal converting method for a chipset, the signal converting method comprising the following steps:

providing a first clock;

providing a second clock, the first clock and the second clock being in pseudo synchronization, m first clock cycle(s) being equal to n second clock cycle(s), wherein m and n are both positive integers satisfying 2n>m>n;

providing an input signal, the input signal comprising a first ready head signal and a first ready tail signal;

generating a delayed ready head signal by delaying the first ready head signal for one first clock cycle;

generating a delayed ready tail signal by delaying the first ready tail signal for one first clock cycle;

generating m phase signals, alternatively appearing as enabled signals in every m first clock cycles, the enabled period of each of the m phase signals appearing as an enabled signal being equal to the first clock cycle;

generating an extension signal, appearing as an enabled signal under the case of both the delayed ready tail signal and a first phase signal of the m phase signals appearing as enabled signals;

generating an extension ready tail signal from part of the enabled first ready tail signal delayed for the first clock cycle, wherein the first ready tail signal is delayed for one first clock cycle when the extension signal and the first ready tail signal both appear as enabled signals;

generating an extension ready head signal, from part of the enabled first ready head signal delayed for the first clock cycle, wherein the first ready head signal is delayed for one first clock cycle when the extension signal and the first ready tail signal both appear as enabled signals; and generating an output signal from the first clock, the second clock, the extension ready tail signal, the extension ready head signal and the m phase signals.

25. A signal converting method according to claim 24, wherein the output signal comprises a second ready head signal and a second ready tail signal.

26. A signal converting method according to claim 24, wherein the first clock is a DRAM clock.

27. A signal converting method according to claim 26, wherein the second clock is a main system clock.

28. A signal converting method according to claim 27, wherein the input signal is a response signal.

29. A signal converting method according to claim 24, wherein the first ready head signal is generated in a head signal of the enabled input signal.

30. A signal converting method according to claim 24, wherein the first ready tail signal is generated in a tail signal of the enabled input signal.

31. A signal converting method according to claim 24, wherein the number of the first clock cycles in the enabled first ready head signal is equivalent to the number of the first clock cycles in the enabled first ready tail signal, the number of the second clock cycles in the enabled second ready head signal and the number of the second clock cycles in the enabled second ready tail signal.

32. A signal converting method according to claim 24, wherein m is 3 and n is 2.

33. A signal converting method according to claim 24, wherein the enabled first ready head signal is separated from each other.

34. A signal converting method according to claim 24, wherein the chipset is a chipset in a computer mainboard.

35. A signal converting device in a chipset, converting an input signal, which refers to a first clock, into an output signal, which refers to a second clock, m cycle(s) of the first clock being equal to n cycle(s) of the second clock, wherein m and n are both positive integers satisfying 2n>m>n, the signal converting device comprising:

a first flip-flop, receiving the first clock and a first ready head signal of the input signal, and outputting a delayed ready head signal which is the result of the first ready head signal being delayed for one first clock cycle;

a second flip-flop, receiving the first clock and a first ready tail signal of the input signal, and outputting a delayed ready tail signal which is the result of the first ready tail signal being delayed for one first clock cycle;

a logic gate, receiving the delayed ready tail signal and a phase signal, and outputting an extension signal, wherein the extension signal is enabled when both the delayed ready tail signal and the phase signal are enabled;

a first multiplexer, receiving the first ready tail signal, the delayed ready tail signal and the extension signal, and outputting an extension ready tail signal under the control of the extension signal, wherein the first multiplexer takes the delayed ready tail signal as the extension ready tail signal when the extension signal and the first ready tail signal both appear as enabled signals;

a second multiplexer, receiving the first ready head signal, the delayed ready head signal and the extension signal, and outputting an extension ready head signal under the control of the extension signal, wherein the second multiplexer takes the delayed ready head signal as the extension ready head signal when the extension signal and the first ready tail signal both appear as enabled signals; and a signal converter, receiving the extension ready tail signal, the extension ready head signal, the first clock and the second clock, and outputting a second ready head signal and a second ready tail signal of the output signal;

wherein the first clock and the second clock are in pseudo synchronization; one cycle of the phase signal is m times of one first clock cycle; and one period for the enabled phase signal is equal to one first clock cycle.

* * * * *